United States Patent
Chang et al.

(10) Patent No.: US 6,526,996 B1
(45) Date of Patent: Mar. 4, 2003

(54) DRY CLEAN METHOD INSTEAD OF TRADITIONAL WET CLEAN AFTER METAL ETCH

(75) Inventors: Hong-Long Chang, Hsin-Chu (TW); Ming-Li Kung, Kee-Lung (TW); Hungyueh Lu, Hsin-Chu (TW); Fang-Fei Liu, Hsin-Chu (TW)

(73) Assignee: ProMos Technologies, Inc., Hsin-Chu (TW)

( * ) Notice: Subject to any disclaimer, the term of this patent is extended or adjusted under 35 U.S.C. 154(b) by 79 days.

(21) Appl. No.: 09/591,848

(22) Filed: Jun. 12, 2000

(51) Int. Cl.$^7$ ................................................. C25F 5/00
(52) U.S. Cl. .................... 134/1.3; 134/1.2; 134/26; 134/902; 438/707; 438/710; 438/711; 438/906; 216/58; 216/64; 216/67; 216/70; 216/77
(58) Field of Search ................... 134/1.3, 1.2, 26; 438/689, 734, 712, 707, 710, 711, 906; 216/70, 76, 58, 67, 64, 77; 430/296

(56) References Cited

U.S. PATENT DOCUMENTS

| | | | |
|---|---|---|---|
| 4,501,061 A | 2/1985 | Wonnacott | 29/591 |
| 5,378,653 A | 1/1995 | Yanagida | 437/194 |
| 5,578,133 A | 11/1996 | Sugino et al. | 134/2 |
| 5,578,161 A * | 11/1996 | Auda | 156/345 |
| 5,599,743 A | 2/1997 | Nakagawa et al. | 437/194 |
| 5,667,630 A * | 9/1997 | Lo | 216/67 |
| 5,709,757 A | 1/1998 | Hatano et al. | 134/22.14 |
| 5,795,831 A | 8/1998 | Nakagama et al. | 438/714 |
| 5,849,639 A * | 12/1998 | Molloy et al. | 438/714 |
| 5,882,489 A | 3/1999 | Bersin et al. | 204/192.35 |
| 5,906,948 A * | 5/1999 | Liu et al. | 216/70 |
| 5,908,319 A | 6/1999 | Xu et al. | 438/725 |
| 5,976,986 A | 11/1999 | Naeem et al. | 438/714 |
| 6,017,826 A | 1/2000 | Zhou et al. | 438/720 |
| 6,146,542 A * | 11/2000 | Ha et al. | 216/2 |
| 6,303,513 B1 * | 10/2001 | Khan et al. | 156/345 |
| 6,358,670 B1 * | 3/2002 | Wong et al. | 430/296 |
| 6,379,574 B1 * | 4/2002 | Ou-Yang et al. | 216/49 |

* cited by examiner

Primary Examiner—Randy Gulakowski
Assistant Examiner—M. Kornakov
(74) Attorney, Agent, or Firm—George O. Saile; Stephen B. Ackerman; Stephen G. Stanton

(57) ABSTRACT

A dry cleaning method for use in semiconductor fabrication, including the following steps. An etched metallization structure is provided and placed in a processing chamber. The etched metallization structure is cleaned by introducing a fluorine containing gas/oxygen containing gas mixture into the processing chamber proximate the etched metallization structure without the use of a downstream microwave while applying a magnetic field proximate the etched metallization structure and maintaining a pressure of less than about 50 millitorr within the processing chamber for a predetermined time.

20 Claims, 3 Drawing Sheets

DRY CLEAN METHOD INSTEAD OF TRADITIONAL WET CLEAN AFTER METAL ETCH

FIELD OF THE INVENTION

The present invention relates generally to methods of forming metal structures in semiconductor devices and specifically to methods of using a dry cleaning method instead of a traditional wet clean method after metal etch.

BACKGROUND OF THE INVENTION

Prevention of metal corrosion and pitting defects with conventional wet cleaning methods after metal etching is difficult. Wet cleaning methods can leave chlorine ($Cl_2$) trapped in a thin sidewall polymer which maximizes corrosion and pitting of, for example, an aluminum (Al) or aluminum alloy substrate. If a thicker sidewall polymer is formed to minimize the exposure of the aluminum/aluminum alloy substrate to $Cl_2$, the difficulty of a more narrow window within which to perform the wet clean arises.

Therefore, passivation (formation of the sidewall polymer within the etched structure) during dry etching and clean step is a critical step. Sometimes an adequate passivation step followed by a poor clean step will also cause pitting and corrosion. With device dimensions, or design rule, getting smaller and smaller, the influence of any such defects on device performance and reliability is becoming greater and greater.

In high ion density reactors using high power processes, certain problems present. One such problem is a high rate of resist erosion and loss of a substantial amount of substrate dielectric, generally silicon oxide ($SiO_2$). This process also is more prone to corrosion known as "mouse bites" characterized as an undesirable lateral loss of Al(Cu).

Another problem is that a metal to tungsten (W) galvanic reaction erodes the interface of the metal Al(Cu) and the W stud. This leads to the loss of W and an increased Rc.

A further problem is the ring type residue, or when a high Rc occurs at the wafer edge due to penetration of TiN from an ACT wet clean.

Also, metal corrosion can occur that is caused by the reaction of chlorine gas and humidity to form HCl acid.

U.S. Pat. No. 4,501,061 to Wonnacott et al. describes a method for stripping an organic photoresist layer from a semiconductor device using $CF_4$ and $O_2$ plasma. The photoresist layer is oxidized with oxygen plasma and residual sulfur species are subsequently removed using a fluorine-containing plasma.

U.S. Pat. No. 5,378,653 to Yanagida describes a method of forming an Al-based pattern whereby dry etching with high selectively of an Al-based metallization layer and effective preventive measures for after-corrosion can be realized. If after etching residual chlorine is removed by $O_2$ plasma ashing or plasma processing using a fluorine based gas, durability to after-corrosion can be improved further.

U.S. Pat. No. 5,599,743 to Nakagawa et al. describes a method of manufacturing a semiconductor device that includes etching an aluminum or alloy film through a mask by chlorination and/or bromination with plasma. The film is exposed to either: a gas plasma not liable to deposit or oxidize, but capable of substituting fluoride for chloride and/or bromide; or a gas mixture plasma comprising hydrogen and the above mentioned gas. The device is then washed with water and the mask is removed.

U.S. Pat. No. 5,976,986 to Naeem et al. describes a low pressure and low power $Cl_2$/HCl process for sub-micron metal etching. $Cl_2$ and HCl are used as reactant species by creating a transformer coupled plasma with power applied to electrodes positioned both above and below a substrate with metallization thereon to be etched. Three layer metallizations which include bulk aluminum or aluminum alloy sandwiched between barrier layers made from, for example, Ti/TiN, are etched in a three step process wherein relatively lower quantities of $Cl_2$ are used in the plasma during etching of the barrier layers and relatively higher quantities of $Cl_2$ are used during etching of the bulk aluminum or aluminum alloy layer. The ratio of etchants $Cl_2$ and HCl and an inert gas, such as $N_2$, are controlled in a manner such that a very thin sidewall layer (10–100 Å) of reaction byproducts during RIE are deposited on the sidewalls of trenches within the etched metallization. The process does not use magnetic fields during etching.

U.S. Pat. No. 5,908,319 to Xu et al. describes forming a microwave plasma in a microwave downstream process from a gas that has a small quantity of fluorine to enhance ashing without substantial oxide loss. This process may be performed before or after other microwave downstream processes or reactive ion etching processes.

U.S. Pat. No. 5,795,831 to Nakayama et al. describes a method of removing a resist layer including a reactive ion etch (RIE) process and a downstream microwave process each performed at a wafer temperature no greater than about 60° C. The low temperature precludes having to pre-heat the resist to drive off solvents.

U.S. Pat. No. 5,709,757 to Hatano et al. describes a dry clean.

U.S. Pat. No. 6,017,826 to Zhou et al. describes a method for forming a patterned layer within a microelectronics fabrication. A first plasma etch method is used to etch a blanket hard mask using an overlying patterned photoresist layer as a first etch mask layer, while exposing a blanket chlorine containing plasma etchable layer. A second plasma etch method is used to etch the exposed blanket chlorine containing plasma etchable layer using at least the patterned blanket hard mask layer as a second etch mask layer. The second plasma etch sidewall passivation layer is formed upon a sidewall of the patterned chlorine containing plasma etchable layer. A third plasma etch method strips the sidewall passivation layer while sequentially oxidizing the sidewall of the patterned chlorine containing plasma etchable layer. The third plasma etch method employs a third etchant gas composition which, upon plasma activation, forms an oxygen containing oxidizing species.

U.S. Pat. No. 5,882,489 to Bersin et al. describes a method for removing a resist while avoiding the use of acids and industrial solvents. Plasma is used to remove organic compounds. The device is rinsed in deionized water (DI), and it is then sputtered with argon to remove inorganic compounds. The order of DI rinsing and argon sputtering may be reversed.

U.S. Pat. No. 5,578,133 to Sugino et al. describes a dry cleaning process for removing metal contaminants from a surface of an oxide film. A reaction area is formed on the oxide film such that a silicon surface is formed corresponding to the reaction area. A dry cleaning gas is supplied to the oxide film including the reaction area to produce silicon halide molecules. The dry cleaning gas being selected from the group essentially consisting of chlorine, bromine, hydrogen chloride, hydrogen bromide, and a mixture thereof. The silicon halide molecules so formed are supplied to a surface of the oxide film and metal elements existing on the surface of the oxide film are removed.

SUMMARY OF THE INVENTION

Accordingly, it is an object of the present invention to provide an improved dry cleaning method after metal etch to prevent metal corrosion and pitting.

Another object of the present invention is to provide an improved dry cleaning method after metal etch to lower the defect density and engineering repair time.

It is a further object of the present invention to provide a fluorine containing gas/oxygen containing gas dry cleaning method without a downstream microwave power that uses magnetic power, a relatively low pressure, and medium bias RF power.

Other objects will appear hereinafter.

It has now been discovered that the above and other objects of the present invention may be accomplished in the following manner. Specifically, an etched metallization structure is provided and placed in a processing chamber. The etched metallization structure is cleaned by introducing a fluorine containing gas/oxygen containing gas mixture into the processing chamber proximate the etched metallization structure without the use of a downstream microwave while applying a magnetic field proximate the etched metallization structure and maintaining a pressure of less than about 50 millitorr within the processing chamber for a predetermined time.

BRIEF DESCRIPTION OF THE DRAWINGS

The features and advantages of the method of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
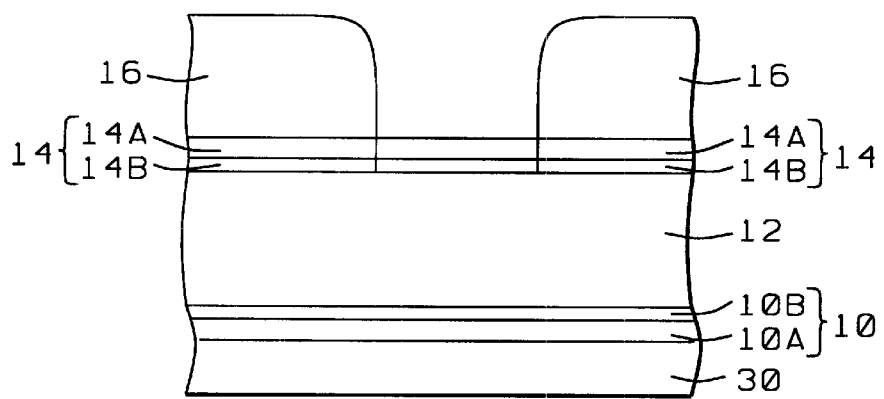
FIGS. 1 through 5 schematically illustrate in cross-sectional representation a preferred embodiment of the present invention.

Unless otherwise specified, all structures, layers, etc. may be formed or accomplished by conventional methods known in the prior art.
Metallization Structure Accordingly as shown in FIG. 1, a conventional aluminum or aluminum alloy metallization typically is comprised of dielectric layer 30 (e.g. ILD, IMD, or oxide), bottom barrier layer 10, bulk aluminum or aluminum alloy 12, and upper barrier layer 14. Patterned photoresist layer 16 overlies upper barrier layer 14.

Barrier layers 10, 14 are preferably comprised of an inner Ti layer 10B, 14B adjacent bulk aluminum or aluminum alloy12, and outer TiN layer 10A, 14A facing away from bulk aluminum or aluminum alloy 12. Barrier layers 10, 14 may also be comprised of other metal or metal alloys such as tantalum, tungsten, molybdenum, chromium, vanadium, niobium, zirconium, or metal-silicon nitrides.

Barrier layers 10, 14 are preferably from about 5 to 150 nm thick.

Bulk aluminum or aluminum alloy 12 is preferably an aluminum copper alloy with 0.5% copper (Al-0.5% Cu or just Al(Cu)). Al(Cu) layer 12 is preferably from about 100 to 1500 nm thick.

Photoresist layer 16 may be comprised of a variety of organic materials, such as Barl 900™ material manufactured by Brewer Science, U.S.A., or Novalic material because they are photosensitive.
Etching of Metallization Structure to Bottom Barrier Layer 10

Figure 2:
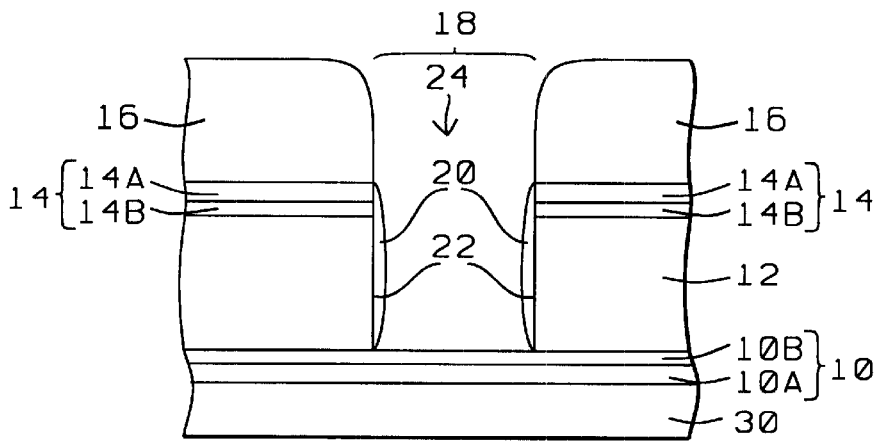

As shown in FIG. 2, as the metallization is etched by a chlorine-containing plasma, certain byproducts such as aluminum chloride are pumped out of the reaction chamber. However, non-gaseous byproducts, which can include carbon, oxygen, titanium, or other materials will form a thin deposited film/layer/polymer 20 on the sidewalls 22 of trench 24 which is formed in region 18.

These byproducts result from the reactions of photoresist 16 with the etchants, as well as the etching byproducts formed from barrier layer 14 (TiN layer 14A/Ti layer 14B)

The metallization etch process includes the following parameters: from about 0 to 100 sccm $BCl_3$ gas flow, from about 0 to 200 sccm $Cl_2$ gas flow, from about 0 to 20 sccm $N_2$ gas flow, from about 0 to 20 sccm $CH_4$ gas flow, and from about 0 to 20 sccm $CHF_3$. Either a Lam Research model TCP 9600 tool or an AMAT (Applied Materials) model DPS metal tool may be used.
Etching of Metallization Structure through Bottom Barrier Layer 10 and Oxide Layer 30

Figure 3:
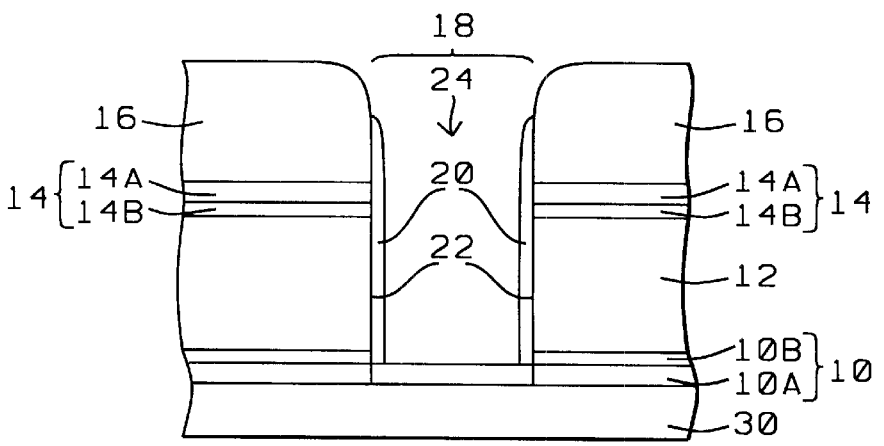

As shown in FIG. 3, as the metallization is etched through bottom barrier layer 10 (Ti layer 10B/TiN layer 10A), polymer layer 20 extends to the etched sidewalls of barrier layer 10.

Polymer layer 20 serves to protect sidewalls 22 from the etchant and preserve the anisotropic nature of the etching, i.e. maintenance of vertical sidewalls 22.

Since the conventional metal stack for aluminum-0.5%copper alloy (Al(Cu)) is photoresist 16/TiN layer 14A/Ti layer 14B/Al(Cu) layer 12/Ti layer 10B/TiN layer 10A/oxide layer 30, the property of the sidewall polymer 20 that forms over the sidewalls 22 of the etched structure is organic plus oxide-like. This polymer 20 is quite a bit stickier on the metal line and sidewall 22 after plasma etching and in-situ photoresist (PR) 16 stripping. A strategy is therefore needed for a dry clean oxide (sidewall polymer 20) and PR 16 removal.

Preferred Embodiment of the Present Invention

The inventors have discovered that removing the polymer layer 20 requires the use of a two step process (Step I and Step II):

STEP I. low pressure of less than 50 millitorr, more preferably from about 10 to 50 millitorr, and most preferably about 20 millitorr;

medium RF power of greater than about 200 W, more preferably from about 200 to 500 W, and most preferably about 300 W;

a magnetic field greater than about 10 gauss (G), more preferably from about 20 to 100 gauss, and most preferably about 20 gauss at a radio frequency of about 13.56 MHz;

and the use of a fluorine containing gas/oxygen containing gas mixture having a preferable fluorine gas:oxygen gas ratio about 1 to 4; the fluorine containing gas may be $CF_4$, $NF_3$, or $CHF_3$, and is preferably $CF_4$; the oxygen containing gas may be $O_2$, or $O_3$, and is preferably $O_2$.

at a hardware setting temperature from about 20 to 100° C.;
for from about 10 to 60 seconds and more preferably from about 28 to 32 seconds, and most preferably about 30 seconds;
followed by a:
STEP II. deionized water (DI) rinse step preferably with megasonic power from about 0 to 500 W to take away all the debris and PR ash.

Figure 4:
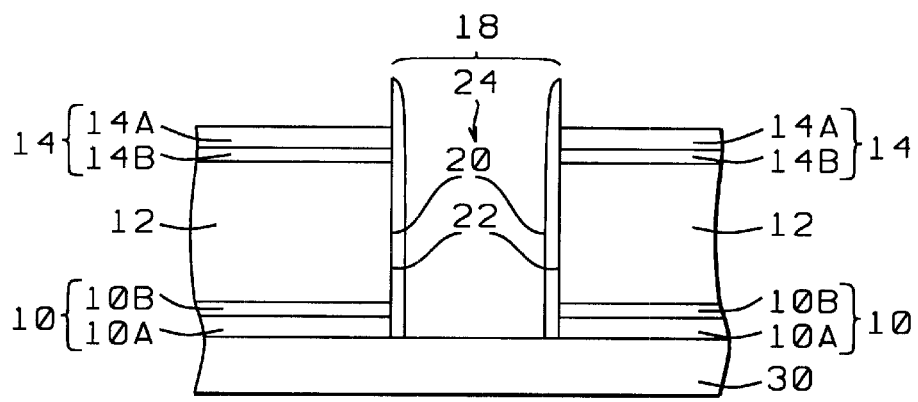

As shown in FIG. 4, initial treatment of the structure of FIG. 3 leaves sidewall polymer residue 20 extending over outer TiN layer 14A.

Figure 5:
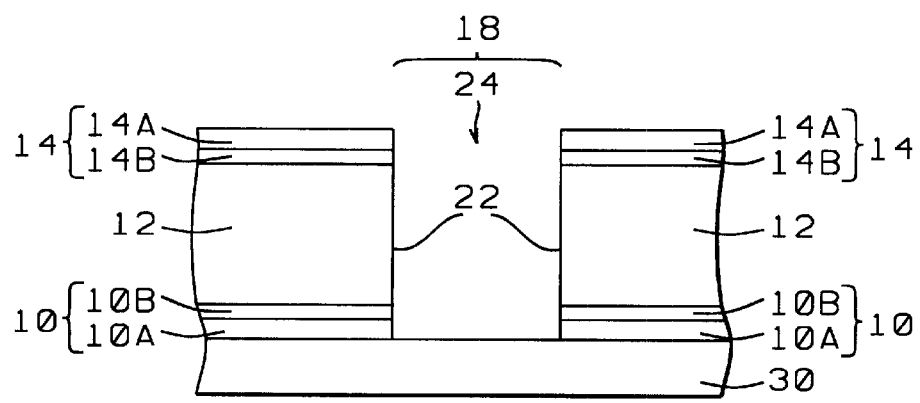

As shown in FIG. 5, further treating the structure of FIG. 4 in accordance with the present invention removes the polymer layer 20 from sidewalls 22 within trench 24 and from outer TiN layer 14A.

Figure 6:
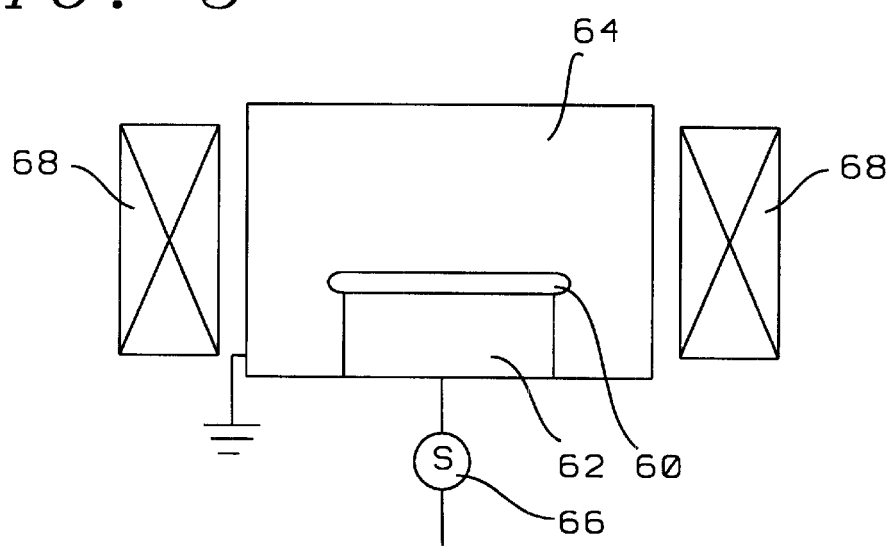
FIG. 6 is a cross-sectional representation of the tool that may be used with the present invention.

FIG. 6 illustrates the major elements of the tool that may be used in the present invention. The wafer 60 is supported by an electrode statistic chuck (ESC) 62 within processing chamber 64. RF power source 66 supplies the necessary RF power. Processing chamber 64 is flanked by magnetic field 68.

Figure 7A:
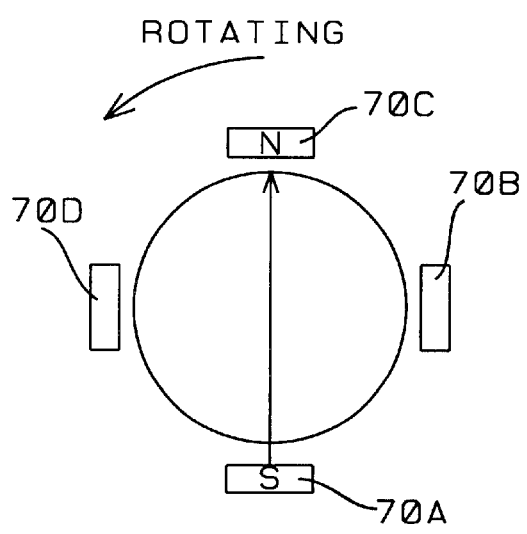
FIGS. 7A and 7B are top down, plan views of the permissible magnet orientations.
Figure 7B:
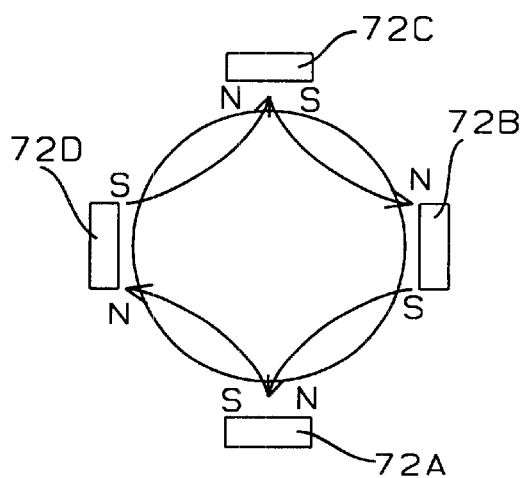

FIGS. 7A and 7B, respectively, illustrate top down, plan views of two permissible magnet 70A, 70B, 70C, 70D; and 72A, 72B, 72C, and 72D, respectively, orientations.

The following tools/models may also be used in the invention: Lam Research model TCP 9600 tool and the AMAT model DPS-metal tool. The following tool configurations may also be used: magnetic enhanced RIE and magnetic confinement triode RIE.

The table below illustrates the contrasting parameters for two other dry cleaning process where "Dry Clean (A)" is a GaSonics vendor process, "Dry Clean (B)" is a Ulvac vendor process which each use a downstream microwave power; and the most preferred parameters for the step one of the present invention ("Invention"):

| Process | Dry Clean (A) | | Dry Clean (B) | | Invention |
|---|---|---|---|---|---|
| Parameter | Step 1 | Step 2 | Step 1 | Step 2 | One Step |
| Platen Temp (° C.) | 30 | 30 | 40 | 30 | 15 |
| Pins (up/down) | Down | Down | 2 | 2 | — |
| Pressure (millitorr) | 700 | 700 | 450 | 350 | 20 |
| Microwave Power | 1400 | — | 1500 | — | — |
| RF/Platen Power | — | 200 | 150 | 225 | 300 |
| $O_2$ (sccm) | 800 | — | 980 | — | 40 |
| $N_2/H_2$ (sccm) | — | 500 | 100 | 480 | — |
| $NF_3$ (sccm) | — | — | 80 | — | — |
| $CF_4$ | 200 | 50 | — | 20 | 10 |
| Magnetic (G) | — | — | — | — | 20 |
| Step Time (sec) | 30 | 30 | 30 | 20 | 30 |

The significant parameters in the above table are in bold. Low pressure—most preferably 20 mT versus 350 to 700 mT in the prior processes; no microwave power versus 1400 to 1500 in the prior processes; and a magnetic field of most preferably 20 gauss versus no magnetic field in the prior processes, used in the dry cleaning method of the present invention admirably removes polymer layer 22 from within trench 24 versus the prior dry clean processes and without the attendant problems of metal corrosion and metal pitting, for example, common to prior wet cleaning processes.

Advantages of the Present Invention

It is believed that the use of a magnetic field with a low pressure without a downstream microwave power is an important feature of the invention as it can improve plasma density and increase ion acceleration.

Further advantages of the present invention include:

metal corrosion and metal pitting are prevented;

the defect density of the devices are lowered;

the time required to repair defects is minimized and so the product cycle time is lowered;

the yield is increased due to the decreased defect density;

elimination of wet chemicals reduces the cost of purchasing, handling and properly disposing such chemicals; and no wet chemicals eliminates a source of electrolytes and so eliminates any deleterious electrogalavanic processes.

Process Known to the Inventors (Not Prior Art)

In processes known to the inventors, fluorine gas is useful for oxide removal (such as $TiO_x$, $AlO_x$, $CuO_x$, and $SiO_2$), and an $O_2/N_2$ gas mixture or an $H_2/N_2$ gas mixture or both gas mixtures is useful for photoresist layer 16 removal/strip. So it would be anticipated that using fluorine gas with an $O_2/N_2$ gas mixture or an $H_2/N_2$ gas mixture or both gas mixtures would be useful to strip photoresist layer 16 and to remove sidewall polymer layer 20.

However, attempts made using microwave power and the above combination gas mixture does not remove sidewall polymer layer 20 well. Further, attempts made to introduce the bottom power (bias RF power) also failed to effectively remove sidewall polymer layer 20.

While particular embodiments of the present invention have been illustrated and described, it is not intended to limit the invention, except as defined by the following claims.

We claim:

1. A dry cleaning method for use in semiconductor fabrication, including the steps of:
   providing an etched metallization structure;
   placing said etched metallization structure in a processing chamber; and
   cleaning said etched metallization structure by introducing a fluorine containing gas/oxygen containing gas mixture into said processing chamber proximate said etched metallization structure without the use of a downstream microwave while applying a magnetic field proximate said etched metallization structure and maintaining a pressure of less than about 50 millitorr within said processing chamber for a predetermined time.

2. The method of claim 1, further including the step of then rinsing said etched metallization structure with deionized water.

3. The method of claim 1, further including the step of rinsing said etched metallization structure with deionized water at a megasonic power from greater than about 0 W to about 500 W.

4. The method of claim 1, wherein said etched metallization structure includes an upper barrier layer, bulk Al-0.5% Cu alloy, and a bottom barrier layer.

5. The method of claim 1, wherein said fluorine containing gas/oxygen containing gas mixture has a fluorine containing gas:oxygen containing gas ratio of about 1:4; said magnetic field is greater than about 10 gauss; said pressure is from about 10 to 50 millitorr, and said predetermined time is from about 28 to 32 seconds.

6. The method of claim 1, wherein said fluorine containing gas/oxygen containing gas mixture has a fluorine containing gas:oxygen containing gas ratio of about 1:4; said magnetic field is from about 20 to 100 gauss; said pressure is about 20 millitorr, and said predetermined time is about 30 seconds.

7. The method of claim 1, wherein said cleaning step includes maintaining an RF power of greater than about 200 W; said magnetic field is from about 20 to 100 gauss at a radio frequency of about 13.56 MHz; and said predetermined time is from about 10 to 60 seconds.

8. The method of claim 1, wherein said cleaning step includes maintaining an RF power of from about 200 to 500 W; said magnetic field is from about 20 to 100 gauss at a radio frequency of about 13.56 MHz; and said predetermined time is from about 28 to 32 seconds.

9. The method of claim 1, wherein said cleaning step includes maintaining an RF power of about 300 W; said magnetic field is about 20 gauss at a radio frequency of about 13.56 MHz; and said predetermined time is about 30 seconds.

10. A dry cleaning method for use in semiconductor fabrication, including the steps of:
   providing an etched metallization structure;
   placing said etched metallization structure in a processing chamber;
   cleaning said etched metallization structure by introducing a fluorine containing gas/oxygen containing gas mixture into said processing chamber proximate said etched metallization structure without the use of a downstream microwave while applying a magnetic field proximate said etched metallization structure and maintaining a pressure of less than about 50 millitorr within said processing chamber for a predetermined time; and
   rinsing said etched metallization structure with deionized water.

11. The method of claim 10, wherein said deionized water rinsing step is conducted at a megasonic power from about 250 to 350 W.

12. The method of claim 10, wherein said etched metallization structure includes an upper barrier layer, bulk Al-0.5% Cu alloy, and a bottom barrier layer.

13. The method of claim 10, wherein said fluorine containing gas/oxygen containing gas mixture has a fluorine containing gas:oxygen containing gas ratio of about 1:4; said magnetic field is greater than about 10 gauss; said pressure is from about 10 to 50 millitorr, and said predetermined time is from about 28 to 32 seconds.

14. The method of claim 10, wherein said fluorine containing gas/oxygen containing gas mixture has a fluorine containing gas:oxygen containing gas ratio of about 1:4; said magnetic field is from about 20 to 100 gauss; said pressure is about 20 millitorr, and said predetermined time is about 30 seconds.

15. The method of claim 10, wherein said cleaning step includes maintaining an RF power of greater than about 200 W; said magnetic field is greater than about 10 gauss at a radio frequency of about 13.56 MHz; and said predetermined time is from about 10 to 60 seconds.

16. The method of claim 10, wherein said cleaning step includes maintaining an RF power of from about 200 to 500 W; said magnetic field is from about 20 to 100 gauss at a radio frequency of about 13.56 MHz; and said predetermined time is from about 28 to 32 seconds.

17. The method of claim 10, wherein said cleaning step includes maintaining an RF power of about 300 W; said magnetic field is about 20 gauss at a radio frequency of about 13.56 MHz; and said predetermined time is about 30 seconds.

18. The method of claim 1, further including the step of rinsing said etched metallization structure with deionized water.

19. The method of claim 1, wherein the etched metallization layer includes a polymer layer thereover that is removed by the cleaning of the etched metallization structure.

20. The method of claim 10, wherein the etched metallization layer includes a polymer layer thereover that is removed by the cleaning of the etched metallization structure.

* * * * *

UNITED STATES PATENT AND TRADEMARK OFFICE
CERTIFICATE OF CORRECTION

PATENT NO.     : 6,526,996 B1                                      Page 1 of 1
DATED          : March 4, 2003
INVENTOR(S)    : Hong-Long Chang et al.

It is certified that error appears in the above-identified patent and that said Letters Patent is hereby corrected as shown below:

<u>Title page,</u>
Item [73], please add -- Mosel Vitelic Inc., Hsin-Chu (TW); Infineon Technologies Inc., Munich (Germany) -- as the second and third assignee respectively.

Signed and Sealed this

Fifteenth Day of July, 2003

JAMES E. ROGAN
*Director of the United States Patent and Trademark Office*